United States Patent [19]
Yamaguchi et al.

[11] Patent Number: 5,547,884
[45] Date of Patent: Aug. 20, 1996

[54] METHOD OF MANUFACTURING A SEMICONDUCTOR MEMORY DEVICE HAVING A COMMON SOURCE REGION

[75] Inventors: Yoshiko Yamaguchi, Tokyo; Yoichi Ohshima, Yokohama, both of Japan

[73] Assignee: Kabushiki Kaisha Toshiba, Kawasaki, Japan

[21] Appl. No.: 351,159

[22] Filed: Nov. 30, 1994

Related U.S. Application Data

[62] Division of Ser. No. 65,898, May 25, 1993, Pat. No. 5,394,001.

[30] Foreign Application Priority Data

May 26, 1992 [JP] Japan ................. 4-132973

[51] Int. Cl.⁶ ................................. H01L 21/265
[52] U.S. Cl. .................. 437/43; 437/48; 437/50; 437/52
[58] Field of Search ............... 437/43, 45, 49, 437/50, 52, 48; 257/390–391, 315

[56] References Cited

U.S. PATENT DOCUMENTS

| | | | |
|---|---|---|---|
| 4,500,899 | 2/1985 | Shirai et al. | 357/23 |
| 5,019,527 | 5/1991 | Ohshima et al. | 437/49 |
| 5,103,274 | 4/1992 | Tang et al. | 357/23.5 |
| 5,318,921 | 6/1994 | Hsue et al. | 437/52 |
| 5,346,842 | 9/1994 | Bergemont | 437/52 |

FOREIGN PATENT DOCUMENTS 2243718 11/1991 United Kingdom.

*Primary Examiner*—H. Jey Tsai
*Attorney, Agent, or Firm*—Banner & Allegretti, Ltd.

[57] ABSTRACT

Field oxide films are formed on a semiconductor substrate of first conductivity type to be spaced from each other in the stripe shape. Gate insulating films are formed on the semiconductor substrate between the field oxide films. Word lines or control gate electrodes are formed on the field oxide films and the gate insulating films to be spaced from each other in the stripe shape along a direction perpendicular to the field oxide films. Grooves are formed in the gate insulating films and the field oxide films sandwiched by the word lines. Source regions of second conductivity type are formed in the semiconductor substrate in the grooves formed in the gate insulating films. A common source wiring region of second conductivity type for electrically connecting the respective source regions is formed in the semiconductor substrate in the grooves formed in the field oxide films. The impurity concentration of the common source wiring region is higher than that of the source regions, and the diffusion depth of the common source wiring region is deeper than that of the source regions.

11 Claims, 9 Drawing Sheets

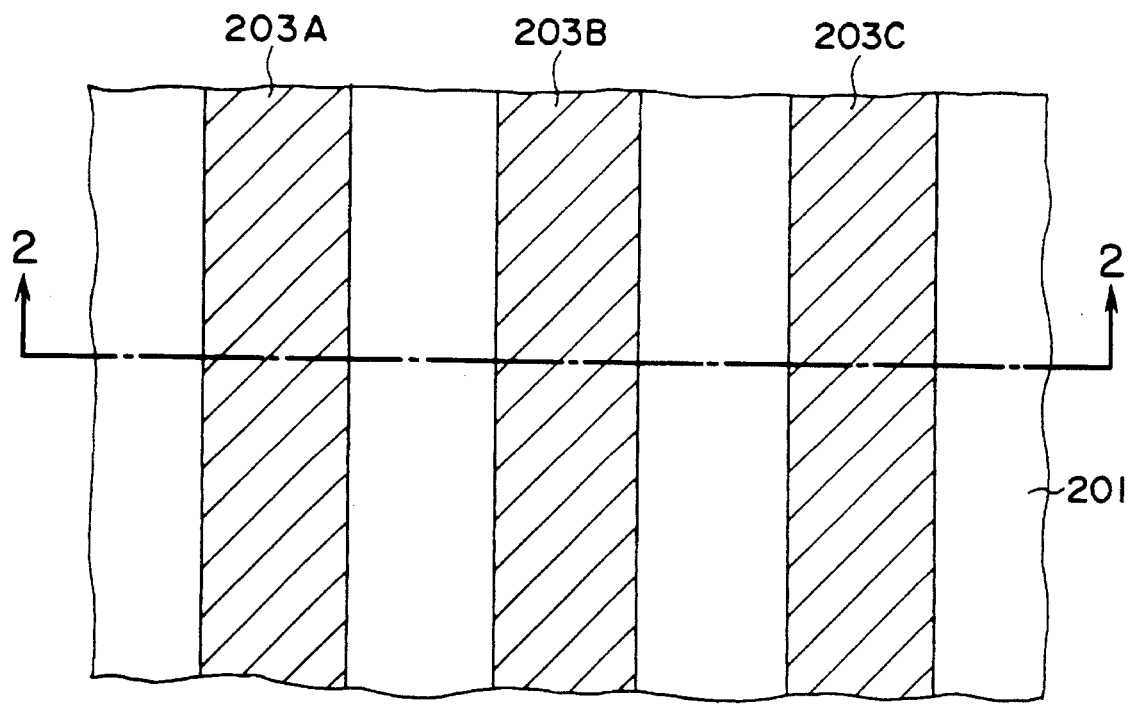
F I G. 1
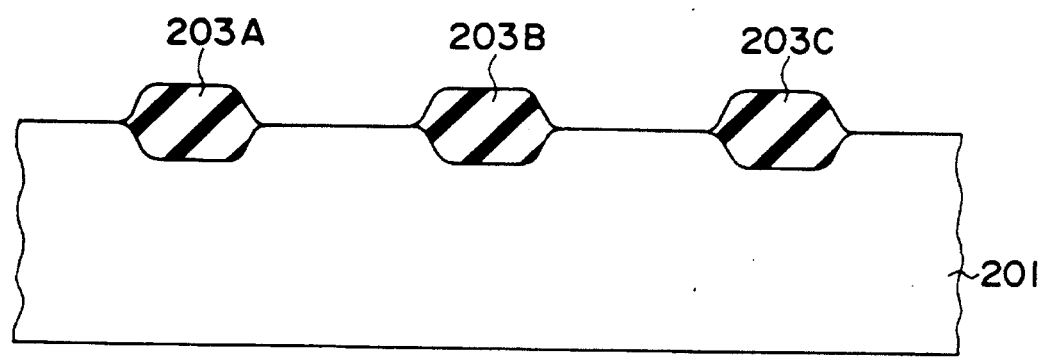
F I G. 2

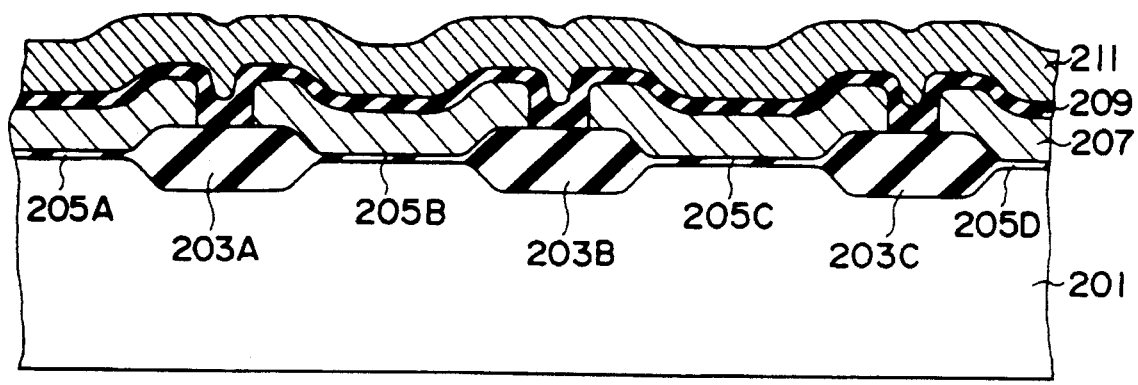
F I G. 3
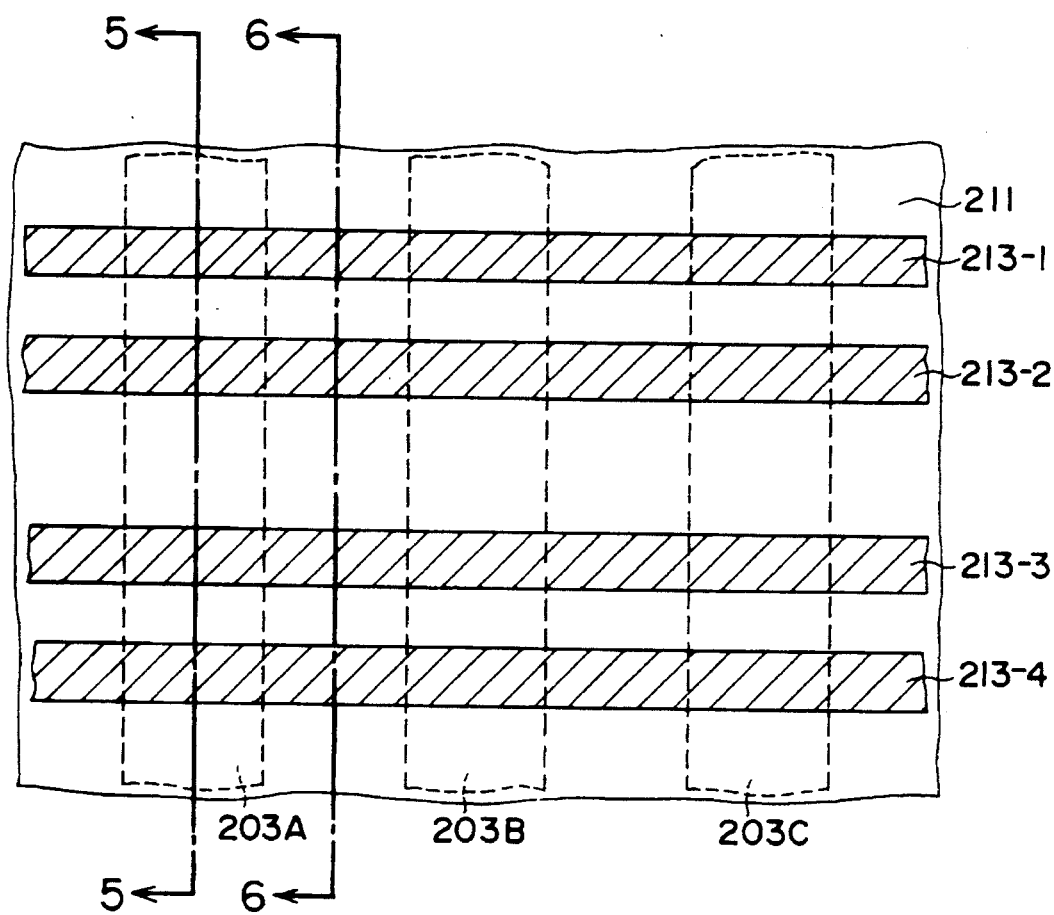
F I G. 4

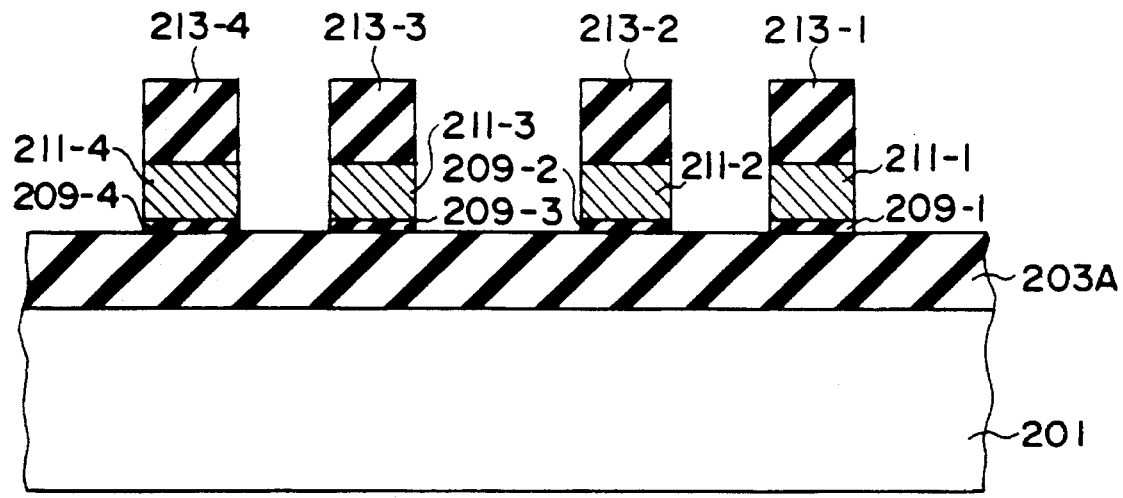
F I G. 5
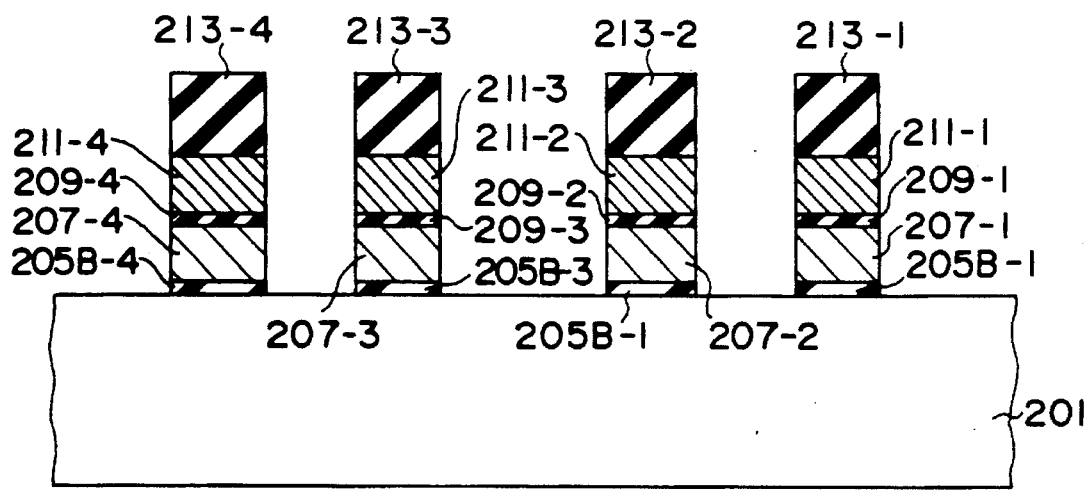
F I G. 6

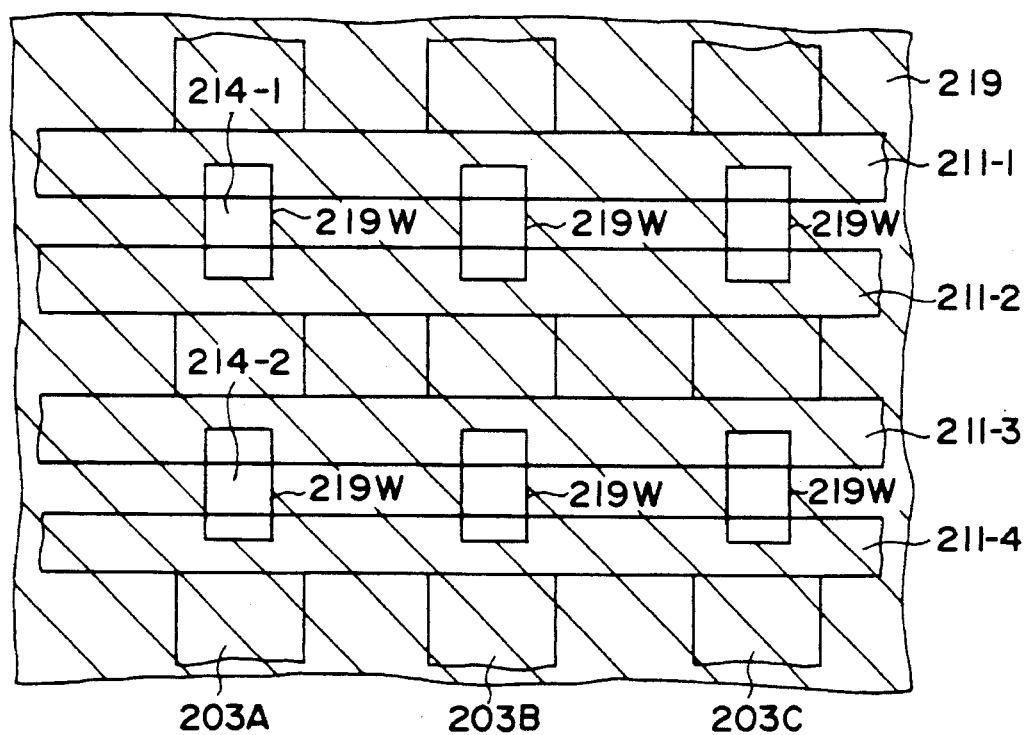
F I G. 9
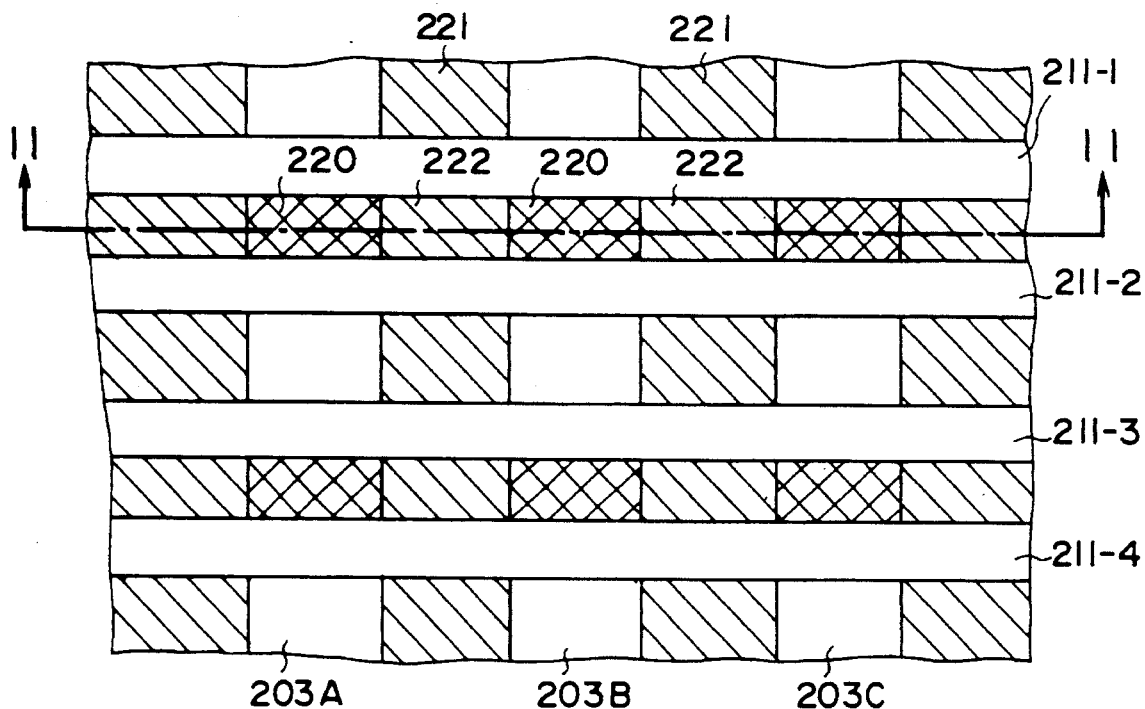
F I G. 10

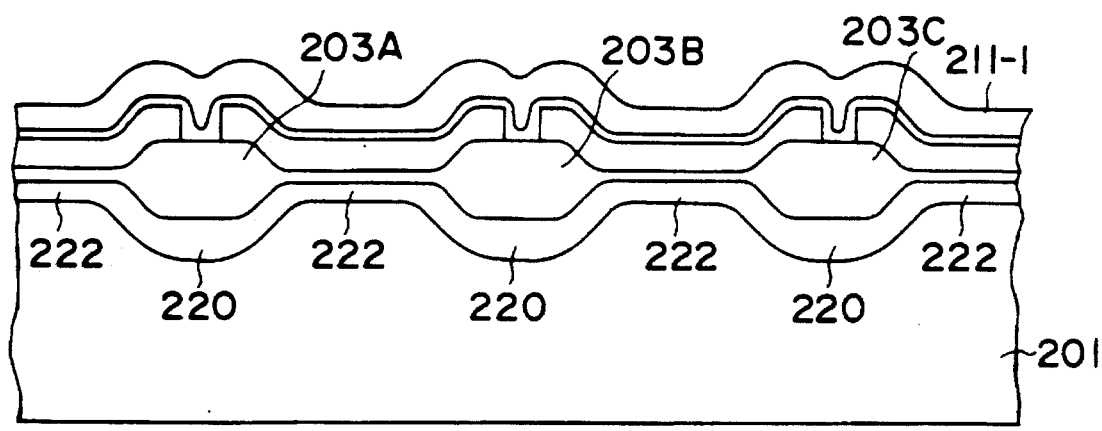
F I G. 11
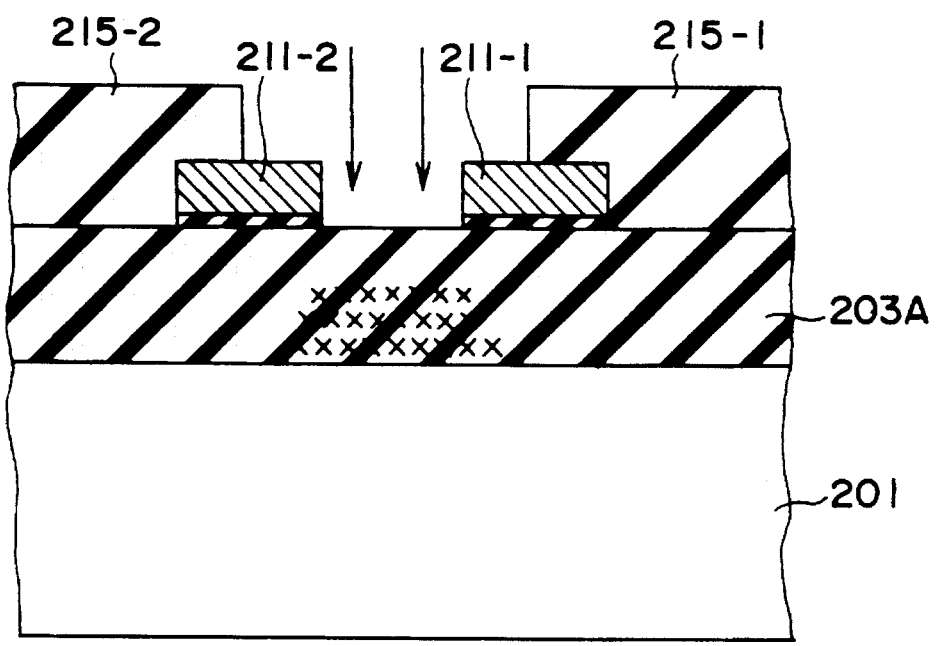
F I G. 12

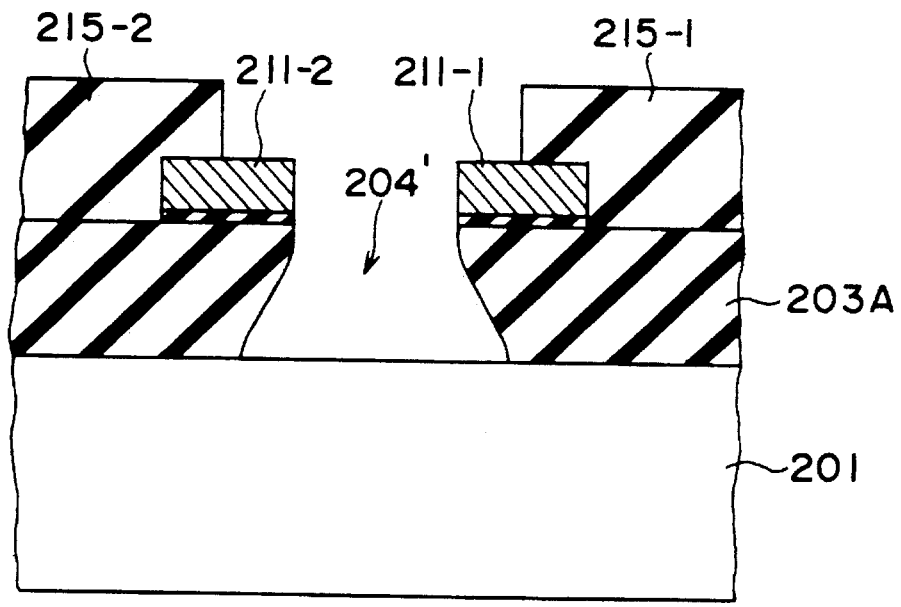
F I G. 13
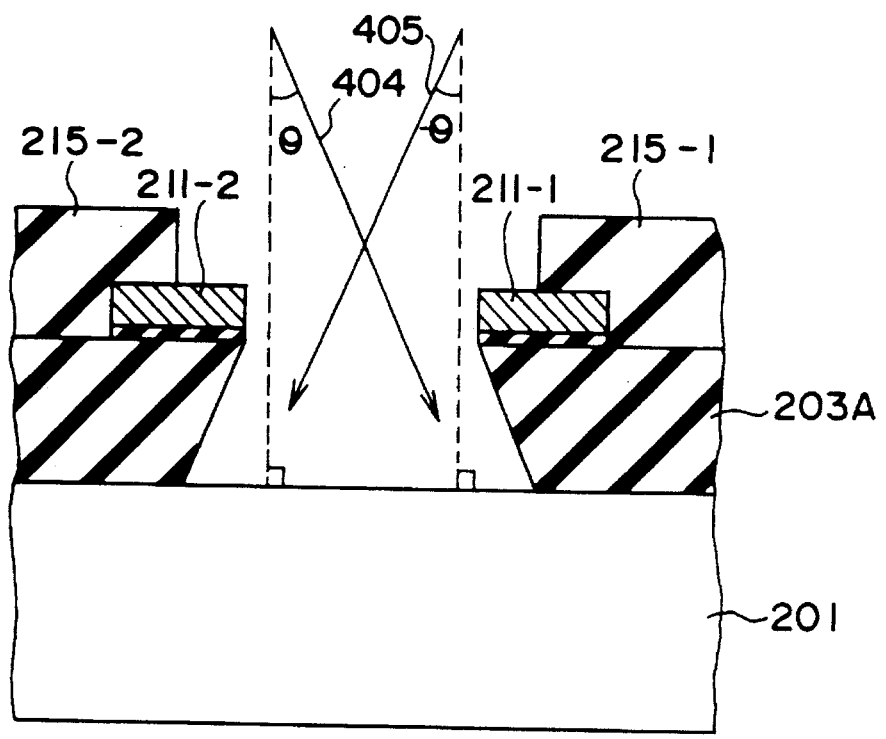
F I G. 14

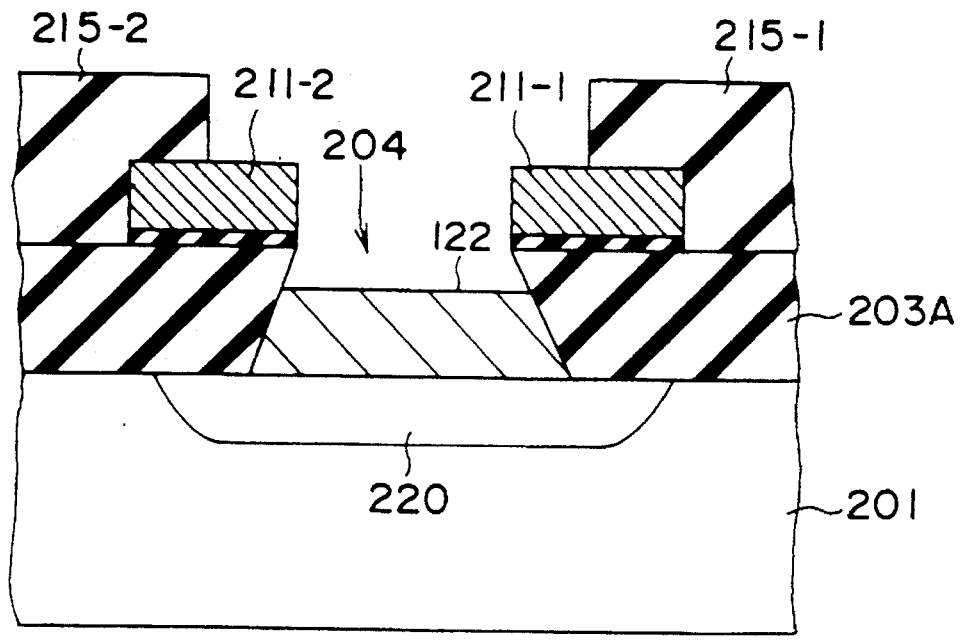
F I G. 15
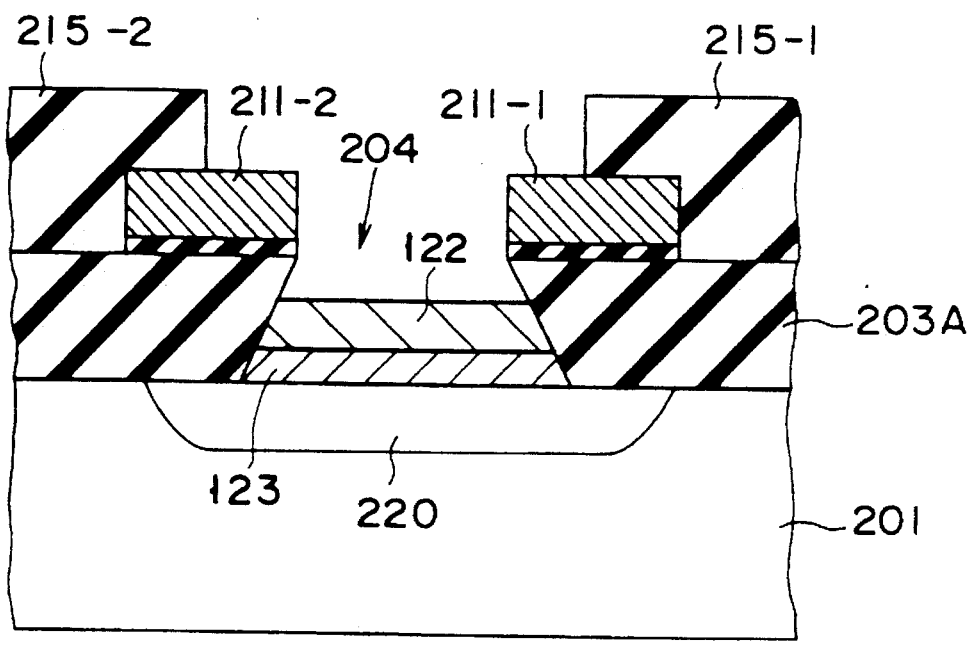
F I G. 16

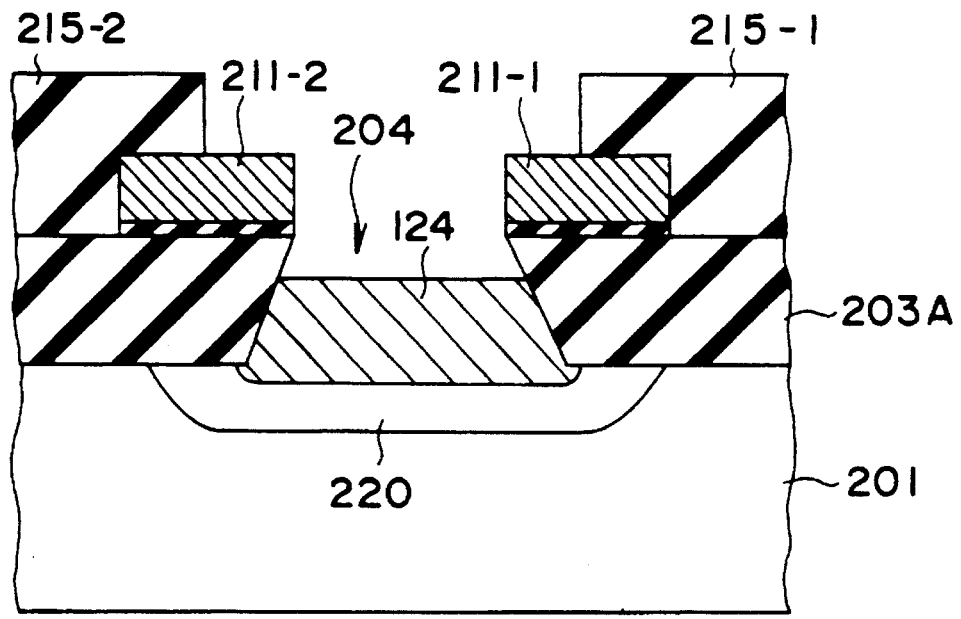
F I G. 17
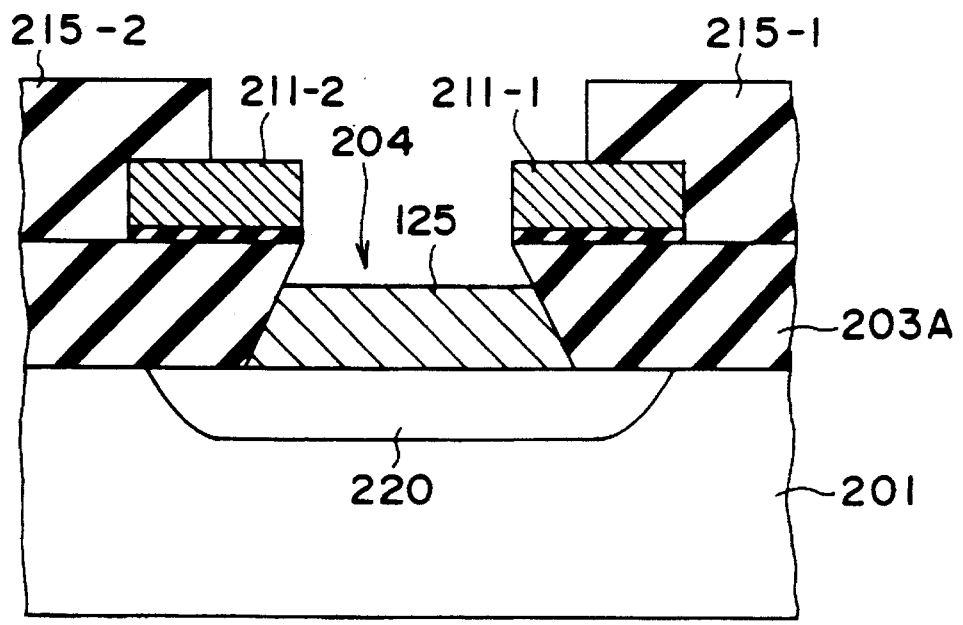
F I G. 18

METHOD OF MANUFACTURING A SEMICONDUCTOR MEMORY DEVICE HAVING A COMMON SOURCE REGION

This application is a division of application Ser. No. 08/065,898, filed May 25, 1993, U.S. Pat. No. 5,394,001.

BACKGROUND OF THE INVENTION

1. Field of the Invention

The present invention relates to a semiconductor device and its manufacturing method to be formed by an SAS technique, and more particularly to a nonvolatile semiconductor memory device and its manufacturing method in which one side edge of word lines (or control gate electrodes) are used as a part of a mask, grooves or trenches are formed in a gate insulating film and a field oxide film, impurity is introduced into a semiconductor substrate exposed to a bottom of the grooves, thereby forming source regions of a memory cell transistors and a common source wiring region for connecting the source regions.

2. Description of the Related Art

Conventionally, in a nonvolatile semiconductor memory device such as an EPROM memory cell transistor, one side edge of word lines (or control gate electrodes) are used as a part of a mask, grooves are formed in a gate insulating film and a field oxide film, and impurity is ion-implanted in a semiconductor substrate exposed in the grooves, thereby forming source regions of the memory cell transistors and a common source wiring region for electrically connecting the source regions in a self-aligning manner. This method is called as a self aligned source (SAS), and is described in, for example, U.S. Pat. No. 5,019,527 and U.S. Pat. No. 4,500,899.

The EPROM memory cell transistor is formed by the SAS technique, the source regions and the common source wiring region (the combination of the source regions and the common source wiring region is referred to herein called as a common source region) can be formed in control gate electrodes in a self-aligning manner. As a result, allowance for masking can be generated, high integration can be easily made, and manufacture yield can be improved.

In order to improve the electrical characteristic of the transistor, it is known that the junction depth of an impurity diffusion layer serving as a source region is must be shallowly formed. However, according to the conventional SAS technique, one impurity diffusion layer is used as source regions and a common source wiring region. In other words, the source regions and the common source wiring region are formed by one impurity diffusion process. Due to this, if the source regions are shallowly formed, the common source wiring region is also shallowly formed. As a result, since the wiring resistance of the common source wiring region is increased and the voltage largely drops at this portion, it is difficult to make an operation speed higher. This becomes a remarkable problem when the width of the wiring region is made narrow and high integration advances.

SUMMARY OF THE INVENTION

A first object of the present invention is to provide a semiconductor device in which an operation speed can be made higher.

A second object of the present invention is to provide a semiconductor device in which an electrical characteristic of a transistor can be improved, and a resistance value of a common source wiring region can be reduced.

A third object of the present invention is to provide a method for manufacturing a semiconductor device in which an operation speed can be made higher.

A fourth object of the present invention is to provide a method for manufacturing a semiconductor device in which an electrical characteristic of a transistor can be improved, and a resistance value of a common source wiring region can be reduced.

The first and second objects can be achieved by a semiconductor device comprising a semiconductor substrate of first conductivity type, a plurality of striped field oxide films (element isolation layers) formed on a main surface of the semiconductor substrate to be spaced from each other along a first direction, a gate insulating film formed on the main surface of the semiconductor substrate between the field oxide films, a plurality of stripe-shaped conductive layers formed on the field oxide films and the gate insulating film to be spaced from each other along a second direction crossing the first direction, grooves formed in the gate insulating film and the field oxide films of the region sandwiched between the plurality of the conductive layers to have a depth reaching the main surface of the semiconductor substrate, the opening width of the field oxide films of the grooves being equal to the space between the conductive layers, and the bottom width thereof being wider than the space between the conductive layers, and a common source region of second conductivity type formed in the semiconductor substrate in the grooves.

According to the above structure, regarding the width of the common source region, the region (common source wiring region) in the grooves formed in the field oxide films forming region is wider than the region (source regions) in the grooves formed in the gate insulating film forming region (element region). Therefore, the resistance value of the common source wiring region can be reduced, and the operation speed can be made higher. Moreover, even if the source regions and the common source wiring region is formed with a shallow junction, the resistance value can be reduced since the width of the common source wiring region is wide. Furthermore, the electrical characteristic of the transistor can be improved, and the resistance value of the common source wiring region can be reduced.

The third and fourth objects can be achieved by a method for manufacturing a semiconductor device comprising the steps of forming a plurality of striped field oxide films spacing from each other along a first direction on a semiconductor substrate of first conductivity type, forming gate insulating films on the main surface of the semiconductor substrate between the field oxide films, forming a plurality of striped conductive layers on the field oxide films and the gate insulating films to be spaced from each other along a second direction crossing the first direction, forming grooves by removing the gate insulating films and the field oxide films between the conductive layers to the depth reaching the main surface of the semiconductor substrate in a state that the conductive layers are used as a part of a mask, the grooves having a bottom portion being wider than an opening portion and the space between the conductive layers, introducing impurity of second conductivity type into the semiconductor substrate in the grooves formed in the gate insulating films so as to form source regions, and introducing impurity of second conductivity type into the semiconductor substrate in the grooves formed in the field oxide films so as to form a common source region for electrically connecting the source regions.

According to the above manufacturing method, the conductive layer is used as a part of the mask and the width of the bottom of the groove formed in the field oxide films forming region is wider than the opening portion. As a result, regarding the width of the main surface of the semiconductor substrate exposed in the groove, the groove formed in the thick field oxide films forming region becomes wider than the groove formed in the thin gate insulating film forming region even if the same conductive layers are used as a mask. Therefore, even if the source regions and the common source wiring regions are formed at the same time, the width of the common source wiring region can be wider than that of the source regions and the resistance value of the common source wiring region can be reduced. Furthermore, if the source regions and the common source wiring region are formed by the different process, each of impurity concentration and the diffusion depth can be set to a suitable value. Therefore, the electrical characteristic of the transistor can be improved, and the resistance value of the common source wiring region can be reduced, so that the operation speed can be made higher.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a pattern plane view explaining a first process in a semiconductor device manufacturing method according to a first embodiment of the present invention;

FIG. 2 is a cross sectional view taken along a line 2—2 of the pattern shown in FIG. 1;

FIG. 3 is a cross sectional view explaining a second process in the semiconductor device manufacturing method according to the first embodiment of the present invention;

FIG. 4 is a pattern plane view explaining a third process in the semiconductor device manufacturing method according to the first embodiment of the present invention;

FIG. 5 is a cross sectional view taken along a line 5—5 of the pattern shown in FIG. 4;

FIG. 6 is a cross sectional view taken along a line 6—6 of the pattern shown in FIG. 4;

FIG. 9 is a pattern plane view explaining a fifth process in the semiconductor device manufacturing method according to the first embodiment of the present invention;

FIG. 10 is a pattern plane view explaining a sixth process in the semiconductor device manufacturing method according to the first embodiment of the present invention;

FIG. 11 is a cross sectional view taken along a line 11—11 of the pattern shown in FIG. 10;

FIGS. 12 and 13 are cross sectional views explaining a semiconductor device manufacturing method according to a second embodiment of the present invention, respectively;

FIG. 14 is a cross sectional view explaining a semiconductor device manufacturing method according to a third embodiment of the present invention;

FIG. 15 is a cross sectional view explaining a semiconductor device manufacturing method according to a fourth embodiment of the present invention;

FIG. 16 is a cross sectional view explaining a semiconductor device manufacturing method according to a fifth embodiment of the present invention;

FIG. 17 is a cross sectional view explaining a semiconductor device manufacturing method according to a sixth embodiment of the present invention; and FIG. 18 is a cross sectional view explaining a semiconductor device manufacturing method according to a seventh embodiment of the present invention.

DETAILED DESCRIPTION OF THE PREFERRED EMBODIMENTS

Figure 7:
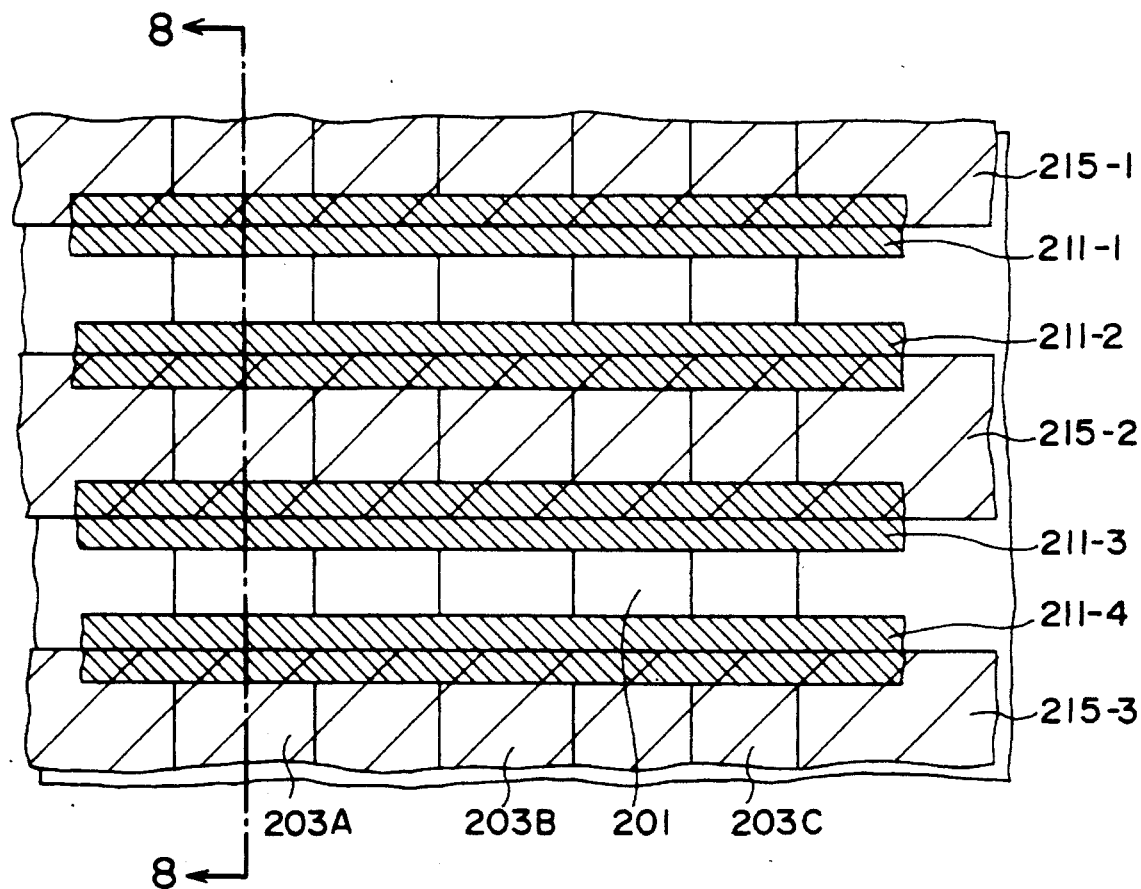
FIG. 7 is a pattern plane view explaining a fourth process in the semiconductor device manufacturing method according to the first embodiment of the present invention.

The following will explain the semiconductor device and its manufacturing method according to the first embodiment of the present invention with reference to FIGS. 1 to 11. FIGS. 1 to 11 sequentially show the manufacturing processes of an NOR type ultraviolet erasable nonvolatile semiconductor memory (hereinafter called as EPROM).

First, as shown in FIGS. 1 and 2, parallel stripe-shaped field oxide films 203A, 203B, and 203C are formed on a main surface of a P-type silicon substrate 201 by a selective oxidation technique such as an LOCOS method. The field oxide films are apart from each other in a first direction.

As shown in FIG. 3, an exposed surface of one substrate 201 is thermally oxidized, thereby first gate oxide films 205A to 205D are formed on an element region. A first polysilicon layer 207 serving as a floating gate electrode is deposited on the resultant structure by a CVD method, and polysilicon layer 207, which is partially on the field oxide film 203, is selectively removed by photoetching. Thereafter, a second gate oxide film 209 is formed on the polysilicon layer 207 and the field oxide film 203, and a second polysilicon layer 211 serving as a control gate electrode is deposited on the gate oxide film 209 by a CVD method.

Generally, the layer 211 is formed by laminating polysilicon and tungsten silicide ($WSi_2$). However, in order to simplify the explanation, the following will explain a case in which the layer 221 is formed of only a polysilicon layer.

Sequentially, photoresist is coated on the polysilicon layer 211 and exposed through a mask, and developed, thereby stripe-shaped resist patterns 213-1 to 213-4 are formed as shown in FIG. 4. The resist patterns 213-1 to 213-4 are used as masks and anisotoropic etching such as an RIE (reactive ion etching) is performed, thereby the polysilicon layers 211, the gate oxide film 209, the polysilicon layer 207 and the gate oxide film 205 are removed. Thereby, as shown in FIGS. 5 and 6, floating gate electrodes 207-1 to 207-4 and control gate electrodes (word lines) 211-1 to 211-4 of the respective memory transistors are formed. As shown in FIG. 5, gate oxide films 209-1 to 209-4 are formed on the field oxide film 203A, and word lines 211-1 to 211-4 are formed on the gate oxide films 209-1 to 209-4, respectively. Also, gate oxide films 205B-1 to 205B-4 are formed on the substrate 201 of the element region, and the floating gate electrodes 207-1 to 207-4 are formed on the gate oxide films 205B-1 to 205B-4, respectively. The gate oxide films 209-1 to 209-4 are formed on the floating gate electrodes 207-1 to 207-4, respectively. Then, the control gate electrodes 211-1 to 211-4 extended to the word lines shown in FIG. 5 are formed on the gate oxide films 209-1 to 209-4. The control gate electrodes extend in a second direction which crosses, and may be perpendicular to, the first direction. Thereafter, the resist patterns 213-1 to 213-4 are removed.

Figure 8:
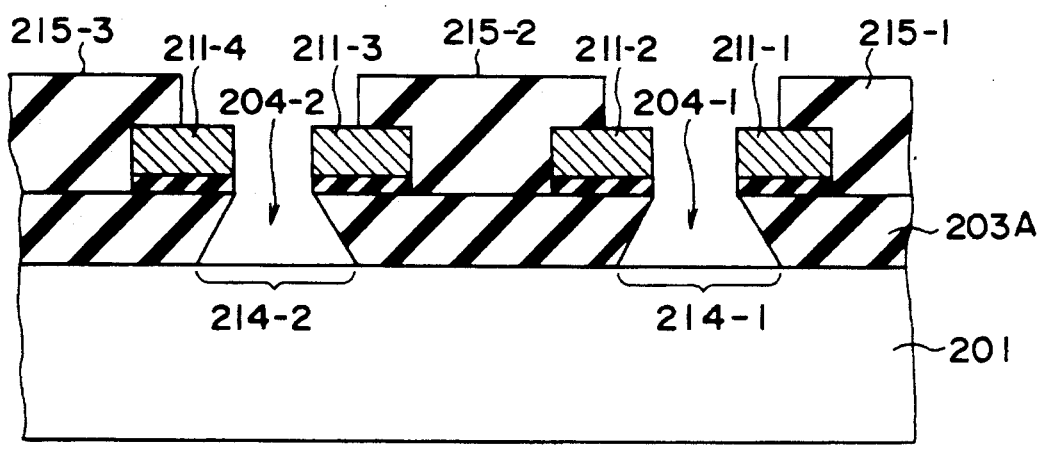
FIG. 8 is a cross sectional view taken along a line 8—8 of the pattern shown in FIG. 7.

Next, as shown in FIG. 7, the portion formed between two word lines (serving as a control gate electrode over the floating gate electrode) is masked on every other portion between two word lines by the resist patterns 215-1 to 215-3. Then, the resist patterns 215-1 to 215-3 and one side edge of the respective word lines 211-1 to 211-4 are used as the mask, the gate oxide film 205 and the field oxide film 203 between the word lines are alternately etched and removed, and inverse tapered grooves or trenches 204-1 and 204-2 (the width of the groove becomes larger along the lower portion) are formed. At this time, for forming the grooves 204-1 and 204-2 whose side walls overhang as shown in FIG. 8, a linear ion beam may be obliquely radiated on the main surface of the substrate 201, and etched by the RIE method. After formation of the grooves 204-1 and 204-2, the resist patterns 215-1 to 215-3 are removed.

Thereafter, a mask, which made of photoresist 219 having windows 219W, is formed in each of the grooves 204-1, 204-2, . . . , which are formed on the field oxide films 203A, 203B, 203C as shown in FIG. 9. Then, impurities for forming an N-type impurity diffusion region such as phosphorous are ion-implanted in exposed portions 214-1 and 214-2, . . . of the substrate 201 of the bottom portion of each of the grooves 204-1, 204-2, . . . formed in the field oxide films using the resist pattern 219 as mask under conditions of acceleration voltage of 60 keV, dose of $5 \times 10^{15}$ cm$^{-2}$, number of wafer rotations of 60 rpm, and ion beam tilt of 30°. Thereby, a common source wiring region 220 is formed. In this case, the resistor pattern 219 is not always necessary to be provided. However, if the ion is implanted into a predetermined source region forming regions at a large implantation angle, impurities are introduced under the floating gate of the memory cell transistor, and an short channel effect may occur. Due to this, the resist pattern 219 is used as a mask and it is preferably that the ion be selectively implanted into the common source wire region.

After removing the resist pattern 219, as shown in FIG. 10, N-type impurity such as arsenic is ion-implanted over the entire surface by the acceleration voltage of 40 keV, and thermal treatment is provided, so that source regions 222 and drain regions 221 are formed. In this case, two ion implantations are performed in the common source wiring region 220 by the acceleration voltage of 60 keV and 40 keV, respectively. In this case, since phosphorus whose diffusion speed is high is ion-implanted in the region 220, the junction depth becomes deeper and impurity concentration becomes higher than the case of the source regions 222 as shown in FIG. 11.

Thereafter, similar to the conventional manufacturing method of the MOS integrated circuit, an interlayer insulating film is formed on the resultant semiconductor structure and a metal wiring layer such as aluminum is formed, and a top passivation film is formed.

In the above-mentioned manufacturing process, the reason why the wafer is rotated at the tilt of 30° of the ion beam when impurity is ion-implanted into the bottom portions (common source wiring region) of grooves 204-1,204-2, . . . formed in the field oxide films 203A, 203B, 203C is as follows:

More specifically, this is to implant impurity into the entire surfaces of the regions 214-1, 214-2, . . . of the exposed surface of the exposed substrate 201.

Moreover, the reason why phosphorus having larger diffusion coefficient than arsenic, which is used to form the source and drain regions 222 and 221, is used in the common source wiring region 220 is as follows:

More specifically, this is to sufficiently diffuse phosphorus by the following thermal treatment process such that the impurity diffusion layer is formed to creep under the field oxide films 203A, 203B and 203C. Therefore, the width of the common source wiring region 220 is larger than the prior art, so that the wiring resistance can be reduced.

Furthermore, the reason why the acceleration voltage when the ion-implantation into the common source wiring region 220 is performed is set to be higher than the case that the source and drain regions 222 and 221 are formed is as follows:

More specifically, this is to deepen the junction depth of the impurity diffusion layer, serving as the common source wiring region 220 such that the wiring resistance is reduced.

According to the above-mentioned structure and the manufacturing method, one side edge of the respective word lines (control gate electrodes) 211-1 to 211-4 are used as the mask, and the source regions and the common wiring region 220 are formed by ion-implanting impurity. The width of the common source wiring region 220 becomes wider than that of the source regions 222 even if the source regions 222 are formed to have a shallow junction. As a result, the resistance value of the common wiring region 220 can be reduced. Moreover, the shallow junction is formed in the source region by one ion-implantation, and impurity is ion-implanted in the common source wiring region 220 twice, and impurity whose diffusion speed is high is implanted therein. As a result, impurity concentration of the common source wiring region 220 becomes higher and the junction depth becomes deeper than the source regions 222. The electrical characteristic of the transistors can be improved by forming the source regions 222 to have a shallow junction, and the common source wiring region 220 can be formed to have a deep junction and high impurity concentration. Therefore, the resistance value of the common source wiring region 220 can be sufficiently reduced, and access speed can be made improved.

In the above first embodiment, for forming the inverse tapered grooves 204-1 and 204-2, the RIE method in which the ion beam is obliquely radiated on the main surface of the substrate 201. However, the method using ion-implantation as shown in FIGS. 12 and 13 may be used. More specifically, in the processes shown in FIGS. 7 and 8, the word lines 211-1 to 211-4 and the resist patterns 215-1 to 215-3 are used as the mask as shown in FIG. 12, and impurity ion such as phosphorus is implanted such that its peak concentration reaches a portion close to the surface of the silicon substrate 201 of the field oxide film 203A. Sequentially, as shown in FIG. 13, the field oxide film 203A is removed by anisotoropic etching such as the RIE in which the ion beam is perpendicularly radiated to the main surface of the substrate 201. Since the etching rate becomes high if the impurity concentration is high, a horizontal etching advances in the region where the impurity concentration is high, and there can be formed an inverse tapered groove 204' where the width of the opening portion is wider than that of the bottom portion as shown in FIG. 13.

Moreover, in the above first embodiment, when the ion was implanted in the regions 214-1 and 214-2 where the substrate 201 is exposed in the grooves 204-1 and 204-2 formed in the field oxide film 203A (FIG. 9), the wafer was rotated at the tilt of 30° of the ion beam. However, the tilt is not limited to 30°, and the ion-implantation can be performed without rotating the wafer. In this case, in order to introduce the impurity ion from the overhanging side walls of the grooves 204-1, 204-2, . . . to a portion where the ion beam is interrupted, the angle of the ion-implantation is changed, and the ion-implantation is may be performed obliquely twice. In other words, as shown in FIG. 14, in the first ion-implantation, an ion beam 404 is perpendicularly radiated to the main surface of the substrate 201 at an angle of θ (10° to 40°), and, in the second ion-implantation, an ion beam 405 is radiated to the main surface of the substrate 201 at an angle of −θ (−10° to −40°). Thereafter, impurity, which is implanted after the thermal treatment is provided, may be diffused thereto.

In the rotation ion-implantation and the ion-implantation obliquely performed, if the range of the angle may be set to 10° to 40° in accordance with an aspect ratio, which is determined by the depth of the groove and the inverse tapered angle, a desirable impurity diffusion layer can be relatively easily formed. However, for example, even if phosphorus or arsenic is ion-implanted at a small angle of 0° to 10°, the same impurity diffusion layer can be obtained if the following thermal treatment is suitably performed and impurity is sufficiently diffused.

In the above first embodiment, the common source wiring region 220 was formed by only the impurity diffusion layer. However, it is possible to form a metal layer 122, such as tungsten, on each of the common source wiring region 220, source regions 222 and drain regions 221 or one of these regions by a selective epitaxial growth. If the common source wiring region is structured as mentioned above, the groove 204 is buried by the metal layer 122 in addition to the point that the wiring resistance can be further reduced by the metal layer 122. As a result, flatness of the interlayer insulating film to be formed in the later process is improved. For example, in a case that tungsten is selectively grown on the common source wiring region 220, $H_2$, $SiH_4$ and $WF_6$ are used as reactive gas, and tungsten may be selectively grown on the common source wiring region 220 under the conditions that pressure of these gases is 0.1 Torr, and a growing temperature is 350° C. The above explained the case in which tungsten is selectively grown. However, this is not limited to the selective growth, and other forming methods such as a CVD method and a sputtering method can be used.

The above embodiment explained the case that the polysilicon layer is used as a control gate electrode. However, it is possible to use the layer formed by laminating polysilicon and tungsten silicide ($WSi_2$). Moreover, a metal layer or a silicide layer may be used as the control gate electrode. There is a case in which an insulating layer such as $SiO_2$ is formed on the layer 211.

Moreover, as shown in FIG. 16, it is possible to laminate a silicide layer 123 of the metal under the metal layer 122. Furthermore, other than the metal layer 122 or the silicide layer of the metal 123, the so-called silicide layer 124 shown in FIG. 17 or a silicon layer 125 in which impurity of the same conductivity type as the common source wiring region 220 is doped as shown in FIG. 18 can be formed on at least one of the common source wiring region 220, source regions 222, and drain regions 221.

Even in the structure and methods as shown in FIGS. 16 to 18, similar to the embodiment of FIG. 15, the wiring resistance can be reduced and the flatness of the interlayer insulating film can be improved.

The above embodiments explained the case in which EPROM is formed. However, the present invention is not limited to the EPROM. That is, the present invention can be applied to not only the nonvolatile memory such as EEPROM but also volatile memory if the semiconductor device in which impurity diffusion layer is formed in the bottom of the groove where the field oxide film is etched is used. Furthermore, the above embodiments explained the case in which N-type impurity is doped in the P-type silicon substrate to form the impurity diffusion layer (source regions 222, drain regions 221 and common wiring region 220), thereby the N-channel transistor is formed. However, the present invention can be, of course, applied to the case in which P-type impurity is doped in an N-type silicon substrate to form an impurity diffusion layer, thereby a P-channel transistor is formed. Moreover, in the above embodiments, the impurity diffusion layer was formed by ion-implantation. However, it is needless to say that other methods such as solid phase diffusion or vapor phase diffusion can be used.

What is claimed is:

1. A method for manufacturing a semiconductor device comprising the steps of:

forming a plurality of striped field oxide films on a semiconductor substrate of a first conductivity type, said field oxide films being spaced apart from each other along a first direction;

forming a gate insulating film on a main surface of said semiconductor substrate between said field oxide films;

forming a plurality of striped conductive layers on said field oxide films and said gate insulating film, said conductive layers being spaced apart from each other along a second direction crossing said first direction;

forming grooves be removing said gate insulating film and said field oxide films between said conductive layers to a depth reaching the main surface of said semiconductor substrate wherein said conductive layers are used as apart of a mask, at least portions of said grooves formed in said field oxide films having a bottom portion being wider than an opening portion and than a space between said conductive layers;

introducing impurity of a second conductivity type into said semiconductor substrate in the portions of said grooves formed in said field oxide films, and forming common source wiring regions; and subsequently introducing impurity of the second conductivity type into said semiconductor substrate in portions of said grooves formed in said gate insulating film, and forming source regions, wherein said common source wiring regions electrically connect said source regions to thereby form common source regions.

2. The method for manufacturing the semiconductor device according to claim 1, wherein the step of introducing impurity of the second conductivity type into said semiconductor substrate in the portions of said grooves formed in said field oxide films introduces impurity with higher concentration than the step of introducing impurity of the second conductivity type into said semiconductor substrate in the portions of said grooves formed in said gate insulating film.

3. The method for manufacturing the semiconductor device according to claim 1, wherein the step of introducing impurity of the second conductivity type into said semiconductor substrate in the portions of said grooves formed in said field oxide films introduces impurity having a larger junction depth than the step of introducing impurity of the second conductivity type into said semiconductor substrate in the portions of said grooves formed in said gate insulating film.

4. The method for manufacturing the semiconductor device according to claim 1, wherein the step of forming grooves includes a step of performing anisotoropic etching using an ion beam obliquely radiated on the main surface of said semiconductor substrate wherein said conductive layers are used as a part of the mask.

5. The method for manufacturing the semiconductor device according to claim 1, wherein the step of forming grooves includes a step of ion-implanting impurity to have a peak of concentration in a region close to said semiconductor substrate in said field oxide films wherein said conductive layers are used as a part of the mask, and a step of performing anisotoropic etching using an ion beam radiated perpendicularly to the main surface of said semiconductor substrate wherein said conductive layers are used as a part of the mask.

6. The method for manufacturing the semiconductor device according to claim 1, wherein the step of introducing impurity of a second conductivity type into said semiconductor substrate in the portions of said grooves formed in said field oxide films includes a first step of implanting the impurity at a tilt angle of 10° to 40° relative to the normal to the main surface of said semiconductor substrate wherein said conductive layers are used as a part of the mask, and a second step of implanting the impurity at a tilt angle of −10° to −40° relative to the normal to the main surface of said semiconductor substrate wherein said conductive layers are used as a part of the mask.

7. The method for manufacturing the semiconductor device according to claim 1, further comprising a step of forming a metal layer on said semiconductor substrate in said grooves after the step of forming said common source regions.

8. The method for manufacturing the semiconductor device according to claim 7, wherein said metal layer is formed by a selective epitaxial growth.

9. The method for manufacturing the semiconductor device according to claim 1, further comprising a step of forming a silicide layer on said semiconductor substrate in said grooves after the step of forming said common source regions; and the step of forming a metal layer on said silicide layer.

10. The method for manufacturing the semiconductor device according to claim 1, further comprising a step of forming a silicide layer on the surface of said semiconductor substrate in said grooves after the step of forming said common source regions.

11. The method for manufacturing the semiconductor device according to claim 1, further comprising forming a silicon layer having an impurity of the second conductivity type on the surface of said semiconductor substrate in said grooves after the step of forming said common source regions.

* * * * *